United States Patent
Zipper

(10) Patent No.: US 7,590,205 B2
(45) Date of Patent: Sep. 15, 2009

(54) RECEIVER WITH SLIDING INTERMEDIATE FREQUENCY (IF) ARCHITECTURE AND PROGRAMMABLE BANDWIDTH AND METHOD

(75) Inventor: Eliav Zipper, Tel-Aviv (IL)

(73) Assignee: Intel Corporation, Santa Clara, CA (US)

(*) Notice: Subject to any disclaimer, the term of this patent is extended or adjusted under 35 U.S.C. 154(b) by 596 days.

(21) Appl. No.: 11/374,584

(22) Filed: Mar. 13, 2006

(65) Prior Publication Data

US 2007/0211837 A1  Sep. 13, 2007

(51) Int. Cl.
*H04B 1/10* (2006.01)

(52) U.S. Cl. .................. 375/350; 375/316; 375/340

(58) Field of Classification Search .......... 375/316, 375/340, 350
See application file for complete search history.

(56) References Cited

U.S. PATENT DOCUMENTS

| 7,248,847 | B2* | 7/2007 | Wallace et al. ........... 455/232.1 |
| 7,424,066 | B2* | 9/2008 | Montalvo et al. ........... 375/322 |
| 2002/0075950 | A1 | 6/2002 | Cowley | |
| 2004/0166799 | A1 | 8/2004 | Kral | |
| 2006/0003730 | A1 | 1/2006 | Elder et al. | |
| 2006/0109939 | A1* | 5/2006 | Ciccarelli et al. ........... 375/350 |

FOREIGN PATENT DOCUMENTS

WO    WO-2007/106828 A1    9/2007

OTHER PUBLICATIONS

Crols, Jan, et al., "Low-IF Topologies for High-Performance Analog Front Ends of Fully Integrated Receivers", *IEEE Transactions on Circuits and Systems- II: Analog and Digital Signal Processing, vol. 45, No. 3*, (Mar. 1998),269-282.

Guthrie, Brian, et al., "A CMOS Gyrator Low-IF Filter for a Dual Mode Bluetooth/ZigBee Transceiver", *IEEE Journal of Solid-State Circuits, vol. 40, No. 9*, (Sep. 2005), 1872-1879.

"PCT Application No. PCT/US2007/063914, Written Opinion mailed Aug. 9, 2007", 4 pgs.

"PCT Application No. PCT/US2007/063914, International Search Report mailed Aug. 9, 2007", 3 pgs.

* cited by examiner

*Primary Examiner*—David C Payne
*Assistant Examiner*—Leon Flores
(74) *Attorney, Agent, or Firm*—Schwegman, Lundberg & Woessner, P.A.; Gregory J. Gorrie

(57) ABSTRACT

Embodiments of a multi-mode receiver, transmitter, and method are generally described herein. Other embodiments may be described and claimed. In some embodiments, a sliding IF architecture that uses a zero-IF mixer and partially overlapping baseband filters is employed to operate over various bandwidths and help remove adjacent interferers.

27 Claims, 7 Drawing Sheets

SLIDING IF ARCHITECTURE

SLIDING IF ARCHITECTURE

TRANSMITTER

RECEIVER WITH SLIDING INTERMEDIATE FREQUENCY (IF) ARCHITECTURE AND PROGRAMMABLE BANDWIDTH AND METHOD

TECHNICAL FIELD

Some embodiments of the present invention pertain to wireless communications. Some embodiments pertain to wireless transmitters and receivers with zero intermediate-frequency (IF) and near zero-IF mixers.

BACKGROUND

Wireless transceivers need to operate over variable bandwidths to be able to communicate within different wireless networks and wireless communication systems. For example, a single transceiver may need to be flexible enough to communicate over a 20 megahertz (MHz) bandwidth for some wireless network communications as well as a 220 kilohertz (kHz) to 270 kHz bandwidth for Global System for Mobile communication (GSM) applications. In accordance with the Third-Generation Partnership Project (3GPP) Long-Term Evolution (LTE), for example, cellular transceivers may need to communicate within variable bandwidth classes of channels ranging from 1.25 MHz up to 20 MHz. Conventionally, tunable baseband filters have been used to help meet variable bandwidth requirements, however some of these filters may have difficulty rejecting adjacent interfering signals within the various bandwidths while maintaining a short impulse response. Furthermore, the area consumed by the capacitances needed for the lower bandwidths makes integrated implementations difficult and cost-prohibitive.

Thus, there are general needs for transmitters and receivers that are able to communicate over variable bandwidths while rejecting adjacent interfering signals. There are also general needs for transmitters and receivers that are able to communicate over variable bandwidths that do not need large capacitances allowing for more cost-effective integrated implementations.

DETAILED DESCRIPTION

The following description and the drawings sufficiently illustrate specific embodiments of the invention to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for, those of other embodiments. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Figure 1:
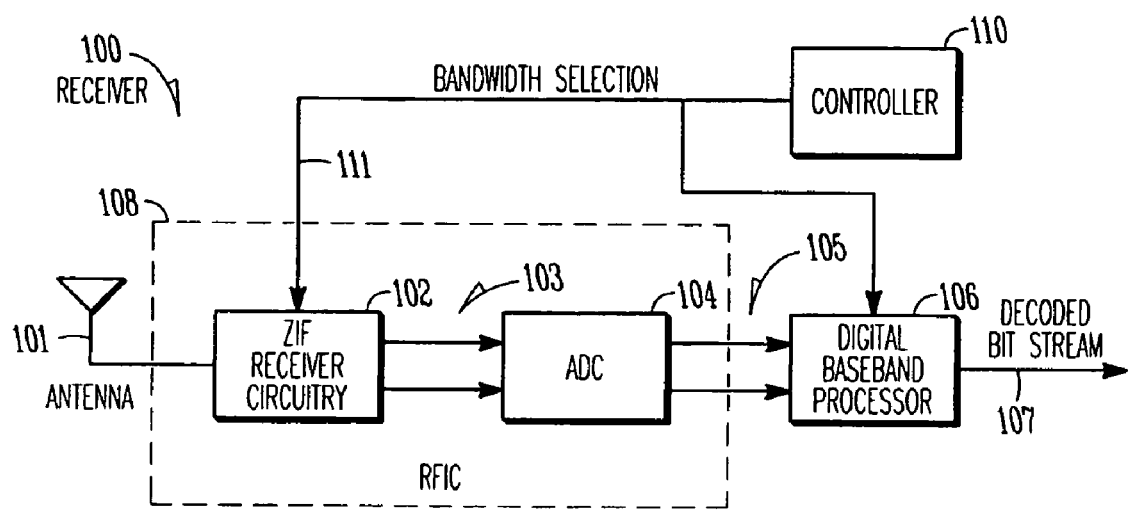
FIG. 1 is a block diagram of a receiver in accordance with some embodiments of the present invention.

FIG. 1 is a block diagram of a receiver in accordance with some embodiments of the present invention. Receiver 100 may be a multi-mode receiver that operates in one or more modes to receive signals within different bandwidths. Receiver 100 may include zero-IF (ZIF) receiver circuitry 102 to receive radio-frequency (RF) signals through antenna 101 within one of a plurality of predetermined bandwidths and to generate analog baseband signals 103. Receiver 100 also includes analog-to-digital conversion (ADC) circuitry 104 to convert analog baseband signals 103 to digital baseband signals 105. Receiver 100 also includes digital baseband processor 106 to process digital baseband signals 105 and generate decoded bit stream 107. In some embodiments, ZIF receiver circuitry 102 and ADC circuitry 104 may be fabricated as part of a single RF integrated circuit (RFIC) 108.

In accordance with some embodiments, receiver 100 may also include controller 110 to generate bandwidth selection control signals 111 based on a selected one of the plurality of predetermined bandwidths. Bandwidth selection control signals 111 may be provided to ZIF receiver circuitry 102 to allow ZIF receiver circuitry 102 to convert the received RF signals within the selected predetermined bandwidths to baseband signals as well as reject adjacent interfering signals. In some of these embodiments, ZIF receiver circuitry 102 may implement a sliding intermediate frequency (IF) architecture and may include zero-IF or near zero-IF circuitry to generate baseband signals 103 by direct down-conversion of received RF signals to baseband signals. These embodiments are described in more detail below.

In some other embodiments, ZIF receiver circuitry 102 may down-convert received signals to one or more intermediate frequencies (IFs) before converting to baseband signals. These embodiments are also described in more detail below.

Although some embodiments of the present invention are described with respect to receivers, the scope of the invention is not limited in this respect. Some embodiments of the present invention are applicable to transceivers including transmitters. In these embodiments, a transmitter may include circuitry that directly up-converts a zero-IF or near zero-IF baseband signal to RF signals in one of the predetermined bandwidths. In these embodiments, the transmitter generally operates in a reverse manner to receiver 100. Some of these embodiments are described in more detail below.

Although receiver 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein. In some embodiments, the functional elements of receiver 100 may refer to one or more processes operating on one or more processing elements.

In some embodiments, receiver 100 may be part of a portable wireless communication device, such as a personal digital assistant (PDA), a laptop or portable computer with wireless communication capability, a web tablet, a wireless telephone, a wireless headset, a pager, an instant messaging device, a digital camera, an access point, a television, a medical device (e.g., a heart rate monitor, a blood pressure monitor, etc.), or other device that may receive and/or transmit information wirelessly.

In some embodiments, the frequency spectrums for the communication signals received by receiver 100 may comprise either a 5 GHz frequency spectrum or a 2.4 GHz frequency spectrum. In these embodiments, the 5 GHz frequency spectrum may include frequencies ranging from approximately 4.9 to 5.9 GHz, and the 2.4 GHz spectrum may include frequencies ranging from approximately 2.3 to 2.5 GHz, although the scope of the invention is not limited in this respect, as other frequency spectrums are also equally suitable. In some broadband wireless access (BWA) network embodiments, the frequency spectrum for the communication signals may comprise frequencies between 2 and 11 GHz, although the scope of the invention is not limited in this respect.

In some embodiments, receiver 100 may be part of a wireless communication device that may communicate orthogonal frequency division multiplexed (OFDM) communication signals over a multicarrier communication channel. The multicarrier communication channel may be within a predetermined frequency spectrum and may comprise a plurality of orthogonal subcarriers. In some embodiments, the multicarrier signals may be defined by closely spaced subcarriers. Each subcarrier may have a null at substantially a center frequency of the other subcarriers and/or each subcarrier may have an integer number of cycles within a symbol period, although the scope of the invention is not limited in this respect. In some embodiments, receiver 100 may communicate in accordance with a multiple access technique, such as orthogonal frequency division multiple access (OFDMA), although the scope of the invention is not limited in this respect. In some embodiments, receiver 100 may be part of a wireless communication device that may communicate using spread-spectrum signals, although the scope of the invention is not limited in this respect.

In some embodiments, receiver 100 may receive signals in accordance with specific communication standards, such as the Institute of Electrical and Electronics Engineers (IEEE) standards including IEEE 802.11(a), 802.11(b), 802.11(g), 802.11 (h), and/or 802.11 (n) standards and/or proposed specifications for wireless local area networks, although the scope of the invention is not limited in this respect as they may also be suitable to transmit and/or receive communications in accordance with other techniques and standards. In some BWA network embodiments, receiver 100 may receive signals in accordance with the IEEE 802.16-2004 and the IEEE 802.16(e) standards for wireless metropolitan area networks (WMANs) including variations and evolutions thereof, although the scope of the invention is not limited in this respect as they may also be suitable to transmit and/or receive communications in accordance with other techniques and standards. For more information with respect to the IEEE 802.11 and IEEE 802.16 standards, please refer to "IEEE Standards for Information Technology—Telecommunications and Information Exchange Between Systems"—Local Area Networks—Specific Requirements—Part 11 "Wireless LAN Medium Access Control (MAC) and Physical Layer (PHY), ISO/IEC 8802-11: 1999," and Metropolitan Area Networks—Specific Requirements—Part 16: "Air Interface for Fixed Broadband Wireless Access Systems," May 2005 and related amendments/versions.

In some embodiments, receiver 100 may implement standards such as the Pan-European mobile system standard referred to as GSM. In some embodiments, receiver 100 may also operate in accordance with packet radio services such as the General Packet Radio Service (GPRS) packet data communication service. In other embodiments, receiver 100 may communicate in accordance with the Universal Mobile Telephone System (UMTS) for the next generation of GSM, which may, for example, implement communication techniques in accordance with 2.5G and 3G wireless standards (see 3GPP Technical Specification, Version 3.2.0, March 2000). In some embodiments, receiver 100 may also communicate in accordance with other air-interfaces including interfaces compatible with the enhanced data for GSM evolution (EDGE) standards (see 3GPP Technical Specification, Version 3.2.0, March 2000), although the scope of the invention is not limited in this respect.

In some embodiments, receiver 100 may be part of a multimode wireless communication device. In these embodiments, receiver 100 may communicate using one or more of several predetermined bandwidths associated with the mode of operation. In some embodiments, receiver 100 may be part of a 3G cellular communication device, a GSM communication device, a communication station for a wireless network, including a WLAN or a BWA communication station, and/or a spread-spectrum communication device including a device that communicates code division multiple access (CDMA) and/or wideband code division multiple access (WCDMA) signals. In some embodiments, receiver 100 may also communicate in accordance with the 3GPP LTE over variable bandwidth classes of channels ranging from 1.25 MHz up to 20 MHz.

Examples of some of the predetermined bandwidths may include approximately a 20 MHz bandwidth for either wireless local area network (WLAN) or wireless fidelity (WiFi) applications, approximately a 1.25 MHz bandwidth for third-generation (3G) cellular applications, approximately a 3 MHz bandwidth for WCDMA applications, approximately a 220 kHz to 270 kHz bandwidth for some GSM applications, and approximately a 110 kHz bandwidth for some other applications. In accordance with the 3GPP LTE, for example, cellular transceivers may need to communicate within variable bandwidth classes of channels ranging from 1.25 MHz up to 20 MHz. Other predetermined bandwidths are also suitable. In some other embodiments, the selected predetermined bandwidth may comprise 40, 60, or even 80 MHz bandwidths for high-throughput WLAN high-throughput (HT-WLAN) applications, or possibly even greater bandwidths for some BWA network applications, such as a Worldwide Interoperability for Microwave Access (WiMax) network. The ability of receiver 100 to selectably receive over two or more predetermined bandwidths provides for multi-mode operation. In some multi-mode embodiments of receiver 100, each bandwidth may correspond to a mode of operation. In some embodiments, receiver 100 may communicate over variable bandwidth classes of channels ranging from 1.25 MHz up to 20 MHz, although the scope of the invention is not limited in this respect.

In the embodiments when receiver 100 is part of a communication station, such as a WLAN or a WiFi communication station, receiver 100 may be part of an access point or mobile station. In some other embodiments, when receiver 100 is part of a BWA network communication station, receiver may be part of a WiMax communication station.

Antennas 101 may comprise one or more directional or omnidirectional antennas, including, for example, dipole antennas, monopole antennas, patch antennas, loop antennas, microstrip antennas, or other types of antennas suitable for transmission of RF signals. In some multiple-input, multiple-output (MIMO) embodiments, two or more antennas may be used. In some MIMO embodiments, instead of two or more antennas, a single antenna with multiple apertures may be used. In these embodiments, each aperture may be considered a separate antenna. In some MIMO embodiments, each antenna may be effectively separated to take advantage of spatial diversity and the different channel characteristics that may result between each of antennas 101 and one or more other wireless communication devices. In some embodiments, antennas 101 may be separated by up to $\frac{1}{10}$ of a wavelength or more.

Figure 2A:
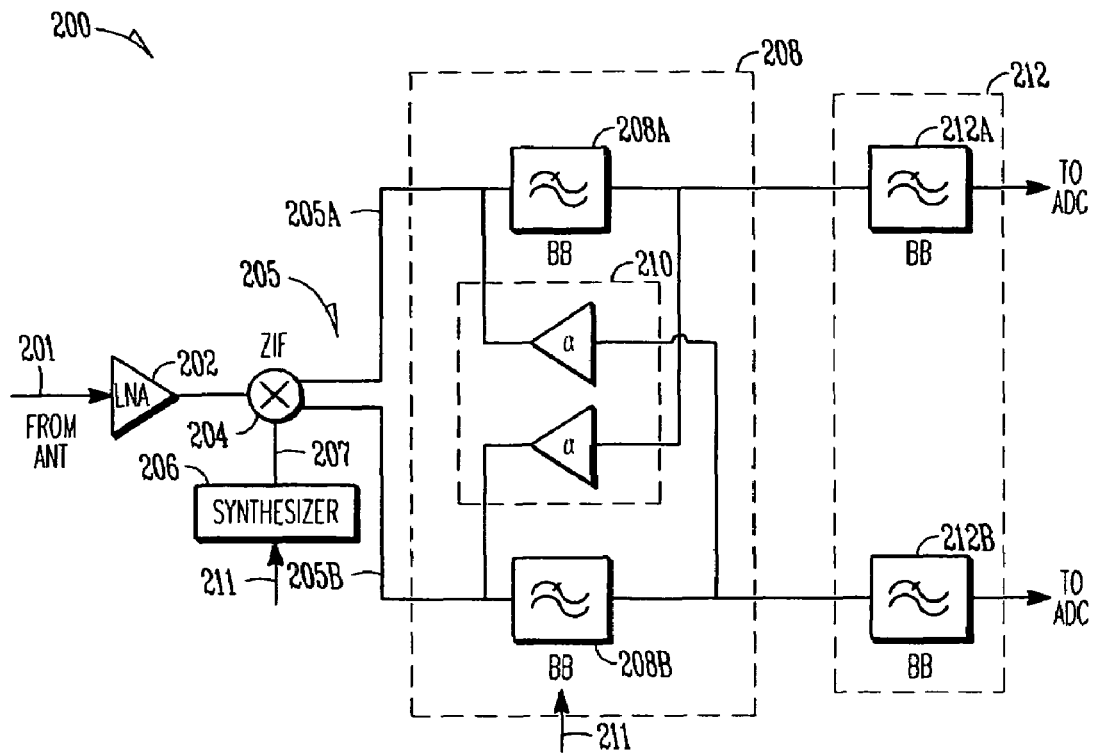
FIGS. 2A and 2B are functional diagrams of receiver circuitry in accordance with some embodiments of the present invention.
Figure 2B:
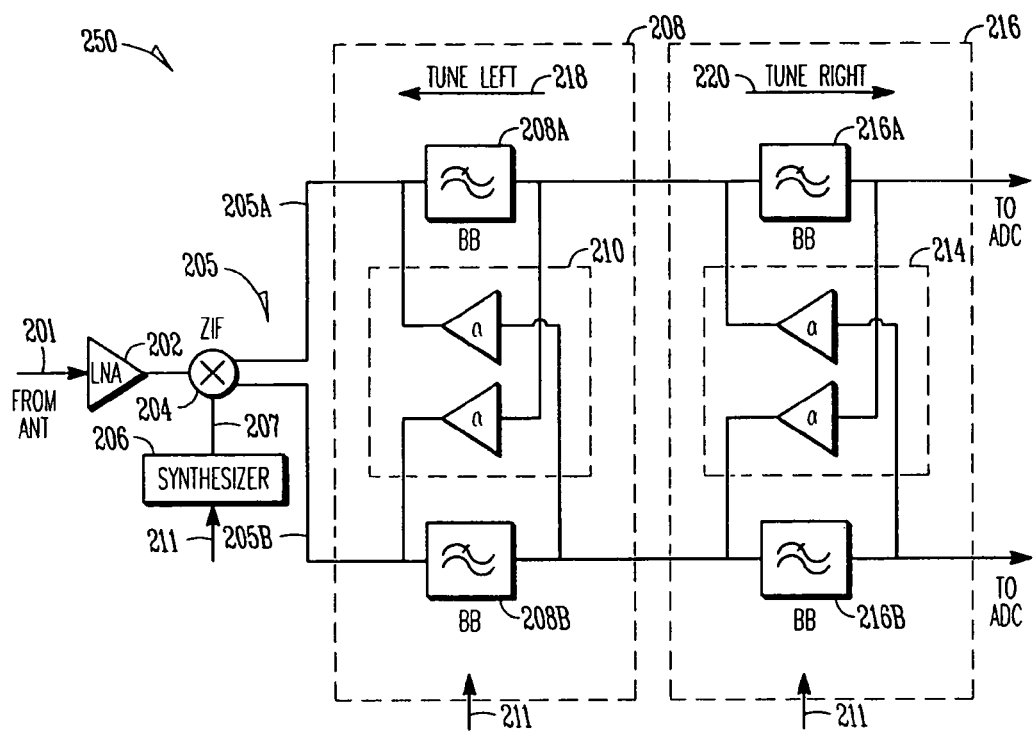

FIGS. 2A and 2B are functional diagrams of receiver circuitry in accordance with some embodiments of the present invention. Receiver circuitry 200 (FIG. 2A) and/or receiver circuitry 250 (FIG. 2B) may be suitable for use as ZIF receiver circuitry 102 (FIG. 1), although other receiver circuitry may also be suitable. Receiver circuitry 200 (FIG. 2A) uses a baseband filter with a shiftable passband and a baseband filter with a fixed passband, while receiver circuitry 250 (FIG. 2B) uses two baseband filters with shiftable passbands. Some of these embodiments are described in more detail below.

In some embodiments, receiver circuitries 200 and 250 include mixer 204 to multiply variable local-oscillator (LO) signal 207 with received RF signal 201 to generate baseband signals 205 having either a zero-IF or a near zero-IF. In some embodiments, mixer 204 may be a zero-IF or near zero-IF mixer. Receiver circuitries 200 and 250 may also include baseband (BB) filter 208 to filter baseband signals 205. Baseband filter 208 may have passband-shifting element 210 to shift the passband of baseband filter 208. In some embodiments, baseband filter 208 ma be a complex baseband filter with a shiftable passband. Receiver circuitries 200 and 250 may also include frequency synthesizer 206 to generate and/or provide variable LO signal 207 based on a selected one of the predetermined bandwidths.

Receiver circuitry 200 may include baseband filter 212 to receive filtered signals from baseband filter 208. The passband of baseband filter 212 may partially, but not fully, overlap the passband of baseband filter 208. In these embodiments, the passband of baseband filter 212 does not substantially overlap with the shifted passband of the baseband filter 208. However, the un-shifted passband of baseband filter 208 may substantially overlap (possibly even fully overlap) the passband of baseband filter 212 resulting in maximum bandwidth operation.

Receiver circuitry 250 comprises baseband filter 216 with passband-shifting element 214 configured to shift the passband of baseband filter 216 as discussed in more detail below. In some embodiments, baseband filter 216 may be a complex baseband filter with a shiftable passband. When shifted, the passband of baseband filter 216 may partially, but not fully, overlap the passband of baseband filter 208. In some embodiments, passband-shifting element 210 and passband-shifting element 214 may comprise cross-coupled feedback elements having a variable gain ($\alpha$) that may shift their passbands based on the selected bandwidth.

In some embodiments, because the passband of baseband filter 212 only partially overlaps the shifted passband of baseband filter 208, adjacent interfering and/or unwanted signals may be removed or filtered out. Likewise, because the shifted passband of baseband filter 216 only partially overlaps the shifted passband of baseband filter 208, adjacent interfering and/or unwanted signals may also be removed or filtered out. The adjacent interfering and/or unwanted signals may refer to signals close to the desired signal. The terms adjacent interfering and/or unwanted signals relate to very close interfering signals that may be filtered out through the passband shifting of baseband filters 208 and/or 216. These interfering signals are distinguishable from more distant interfering signals, sometimes referred as alternate blockers, in-band-blockers, out-of-band blockers, and/or spurs, which may be removed by other circuitry.

In some embodiments, the passbands of baseband filter 208 and baseband filter 212 or 216, when shifted, may overlap by approximately 10%, although the scope of the invention is not limited in this respect. The partial overlap of these baseband filters may be varied through the use of cross-coupling feedback to allow for differing bandwidths without the need for tunable passive devices. In these embodiments, the use of large capacitances, which are conventionally needed for lower bandwidths (e.g., a 110 kHz bandwidth and the 220 kHz to 270 kHz bandwidth for some GSM applications), may be avoided. In some integrated embodiments in which either receiver circuitry 200 or 250 is part of RFIC 108 (FIG. 1), the total area consumed for capacitors may be significantly reduced allowing for much smaller integrated implementations. This may be particularly important for hand-held and portable wireless devices including some GSM applications, although the scope of the invention is not limited in this respect. In these embodiments, this sliding IF approach may achieve zero-IF or near zero-IF while rejecting adjacent interferes.

In receiver circuitry 200, baseband filter 208 may comprise a complex baseband filter with a shiftable passband, and baseband filter 212 may comprise either a real or a complex baseband filter with a fixed passband. In these embodiments, digital baseband processor 106 (FIG. 1) may perform a digital frequency conversion to compensate, at least in part, for any frequency offset at the outputs of baseband filter 212. In these embodiments, the digital frequency conversion is an additional frequency conversion (i.e., in addition to the frequency conversion performed by mixer 204).

In some embodiments, baseband filters with shiftable passbands may comprise complex filters that may realize frequency-shiftable poles or zeros within their bi-quad stages, although the scope of the invention is not limited in this respect. In some embodiments, baseband filters with shiftable passbands may be realized with a pair of frequency-shiftable poles or zeros, although the scope of the invention is not limited in this respect. In some embodiments, the passband of a complex baseband filter may be shifted in frequency by changing or varying the variable gain ($\alpha$) of a passband-shifting element, such as passband-shifting element 210 and/or passband-shifting element 214. Examples of passband-shifting elements are described in more detail below.

Although receiver circuitry 200 is illustrated as having baseband filter 208 with a shiftable passband before baseband filter 212 with a fixed passband, the order of these filters in the signal path may be interchanged. Embodiments of the present invention are equally applicable to receiver circuitry in which baseband filter 212 comes before baseband filter 208.

Although receiver circuitry 200 is illustrated as utilizing digital baseband processor 106 (FIG. 1) to perform a digital frequency conversion to compensate, at least in part, for any frequency offset at outputs of baseband filter 212, the scope of the invention is not limited in this respect. In some alternate embodiments, an analog frequency conversion may be performed.

In receiver circuitry 250, baseband filter 208 may be a complex baseband filter with a shiftable passband and the passband of baseband filter 208 may be shifted in direction 218 by passband-shifting element 210. Baseband filter 216 may also be a complex baseband filter with a shiftable passband, and passband-shifting element 214 may be configured to shift the passband of baseband filter 216 in direction 220, which may be opposite to direction 218 as illustrated. FIG. 2B illustrates directions 218 and 220 as passbands or center frequencies being tuned either right or left, respectively. This illustration is intended to illustrate shifting the passbands or center frequencies of baseband filters 208 and 216 in opposite directions at the same time. In these embodiments that use receiver circuitry 250, digital baseband processor 106 (FIG. 1) may not need to perform an additional digital frequency conversion because the outputs of baseband filter 216 may not necessarily have a frequency offset, as may be the case with receiver circuitry 200 illustrated in FIG. 2A, although the scope of the invention is not limited in this respect. In some embodiments that use baseband filter 216, the analog baseband outputs of baseband filter 216 may have substantially zero frequency offset, and digital baseband processor 106 (FIG. 1) may refrain from performing a digital frequency conversion because a frequency conversion may not be necessary when there is substantially zero frequency offset.

In some embodiments, the variable gain ($\alpha$) of passband-shifting element 210 and/or passband-shifting element 214 may be varied or changed, for example, by switching in differing resistor values or by changing a tuning current, although the scope of the invention is not limited in this respect. Other techniques may also be suitable for varying or changing the gain of passband-shifting element 210 and/or passband-shifting element 214. In some other embodiments, passband-shifting element 210 may shift the passband of baseband filter 208 and/or passband-shifting element 214 may shift the passband of baseband filter 216 by other passband shifting techniques.

In some embodiments, the passbands of baseband filter 208 and/or baseband filter 216 may be shifted based, at least in part, on the selected bandwidth. In some of these embodiments, baseband filter 208 and/or baseband filter 216 may comprise polyphase filters. In these embodiments, passband-shifting element 210 may shift one or more of the poles of baseband filter 208 in response to bandwidth selection control signals 211. Passband-shifting element 214 may also shift one or more of the poles of baseband filter 216 in an opposite direction in response to bandwidth selection control signals 211. Bandwidth selection control signals 211 may correspond to bandwidth selection control signals 111 (FIG. 1). In other embodiments, the zeros of baseband filter 208 and/or baseband filter 216 may be shifted, although the scope of the invention is not limited in this respect.

In some embodiments, controller 110 (FIG. 1) may generate bandwidth selection control signals 111 (FIG. 1) based on the selected predetermined bandwidth. Controller 110 (FIG. 1) may also provide bandwidth selection control signals 111 (FIG. 1) to synthesizer 206 for generating the variable LO signal 207. In these embodiments, synthesizer 206 generates variable LO signal 207 based on bandwidth selection control signals 111 (FIG. 1).

In some embodiments, controller 110 (FIG. 1) generates bandwidth selection control signals 111 allowing receiver 100 (FIG. 1) to select one of a plurality of predetermined bandwidths. In some embodiments, controller 110 (FIG. 1) may select one of the predetermined bandwidth based on a mode that receiver 100 (FIG. 1) is operating in. The mode may be selected by a user, or alternatively, the mode may be automatically selected based on the network/communication signals detected by receiver 100 (FIG. 1), although the scope of the invention is not limited in this respect.

In some integrated embodiments that use receiver circuitry 200, mixer 204, baseband filter 208, passband-shifting element 210, baseband filter 212, synthesizer 206, and ADC circuitry 104 (FIG. 1) may be fabricated as part of a single RFIC, such as RFIC 108 (FIG. 1). In some integrated embodiments that use receiver circuitry 250, mixer 204, baseband filter 208, passband-shifting element 210, baseband filter 216, passband-shifting element 214, synthesizer 206 and ADC circuitry 104 (FIG. 1) may also be fabricated as part of a single RFIC, such as RFIC 108 (FIG. 1). In some of these integrated embodiments, receiver circuitries 200 and 250 may also include low-noise amplifier (LNA) 202 to amplify RF signals 201 received from an antenna source, although the scope of the invention is not limited in this respect.

In some embodiments, when mixer 204 comprises a zero-IF mixer or a near zero-IF mixer, mixer 204 generates in-phase (I) output 205A and quadrature-phase (Q) output 205B. In these embodiments, mixer 204 may receive LO signals separated in phase by substantially ninety degrees. In these embodiments, baseband filter 208 may comprise portion 208A to receive in-phase output 205A and portion 208B to receive in-phase output 205B. In these embodiments, baseband filter 212 may comprise portion 212A to receive the filtered output of portion 208A and portion 212B to receive the filtered output of portion 208B. In some embodiments, portion 212A may receive an in-phase filtered signal from portion 208A and portion 212B may receive a quadrature-phase filtered signal from portion 208B, although the scope of the invention is not limited in this respect. In these embodiments, baseband filter 216 may comprise portion 216A to receive in-phase output 205A and portion 216B to receive quadrature-phase output 205B. An example of a complex baseband filter with passband-shifting elements is described in more detail below.

Although FIGS. 2A and 2B illustrate passband-shifting elements 210 and 214 as summing a function of the output with the input, the scope of the invention is not limited in this respect. In some embodiments, passband-shifting elements 210 and/or 214 may implement a distributed cross-coupling feedback approach. An example of a complex baseband filter with passband-shifting elements that implement distributed cross-coupling feedback is described in more detail below.

Figure 2C:
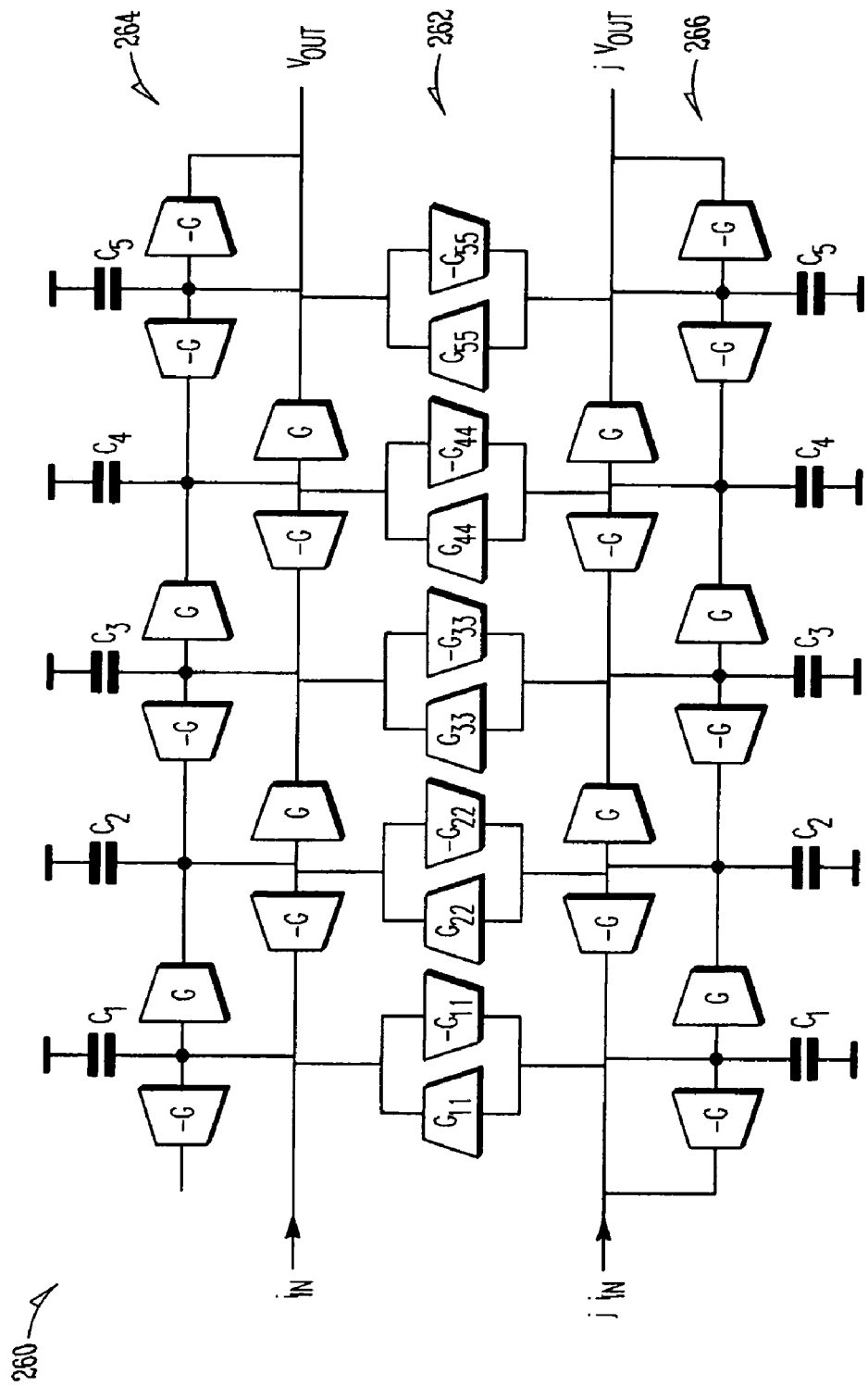
FIG. 2C is an example of a complex baseband filter configuration suitable for use with some embodiments of the present invention.

FIG. 2C is an example of a complex baseband filter configuration suitable for use with some embodiments of the present invention. Complex baseband filter configuration 260 may be suitable for use as baseband filter 208 (FIGS. 2A and 2B) and/or baseband filter 216 (FIG. 2B), although the scope of the invention is not limited in this respect. Complex baseband filter configuration 260 includes cross-coupled feedback elements 262, which may correspond to passband-shifting element 210 (FIG. 2A), passband-shifting element 210 (FIG. 2B) and/or passband-shifting element 214 (FIG. 2B). Complex baseband filter configuration 260 also includes filter portion 264, which may correspond to portion 208A (FIG. 2A) of baseband filter 208 (FIG. 2A), portion 208A (FIG. 2B) of baseband filter 208 (FIG. 2B), and/or portion 216A of baseband filter 216 (FIG. 2B). Complex baseband filter configuration 260 also includes filter portion 266, which may correspond to portion 208B (FIG. 2A) of baseband filter 208 (FIG. 2A), portion 208B (FIG. 2B) of baseband filter 208 (FIG. 2B), and/or portion 216B of baseband filter 216 (FIG. 2B). In some embodiments, portion 264 and portion 266 may correspond respectively to portions 212A and 212B (FIG. 2A), although the scope of the invention is not limited in this respect.

Cross-coupled feedback elements 262 may comprise one or more cross-branch transconductor loops (illustrated as $G_{11}, -G_{11}$ through $G_{55}, -G_{55}$), which produce feedback currents proportional to their inputs. Their output currents may be summed with the input currents of the filter. In some embodiments, the transconductors illustrated in FIG. 2C may comprise transconductor amplifiers, although the scope of the invention is not limited in this respect. In some embodiments, the cross-branch transconductor loops may form a set of gyrators. Although complex baseband filter configuration 260 is illustrated as a fifth-order filter, the scope of the invention is not limited in this respect as other order filters may be used.

In some embodiments, complex baseband filter configuration 260 may operate as a complex integrator in which the cross-branch transconductor loops produce feedback currents proportional to output currents which are summed at the filter's opposite inputs. In some of these embodiments, complex baseband filter configuration 260 may be a bandpass filter.

In some embodiments, the passband or the center frequency of complex baseband filter configuration 260 may be shifted based on the transconductances (e.g., $G_{11}$, $G_{22}$, $G_{33}$, $G_{44}$ and/or $G_{55}$) of distributed cross-coupled feedback elements 262. In accordance with some embodiments, the values of the transconductances may be varied, for example, by varying a bias current or through the use of a feedback capacitance. In some embodiments, bandwidth selection control signal 111 (FIG. 1) may be used to shift the center frequency of complex baseband filter configuration 260 to allow receiver 100 (FIG. 1) to receive within the different bandwidth classes as discussed above while rejecting adjacent interfering signals.

In some embodiments, complex baseband filter configuration 260 may be suitable for use as baseband filter 212 (FIG. 2). In these embodiments, the passband of complex baseband filter configuration 260 may be fixed by refraining from varying the transconductances.

Figure 3A:
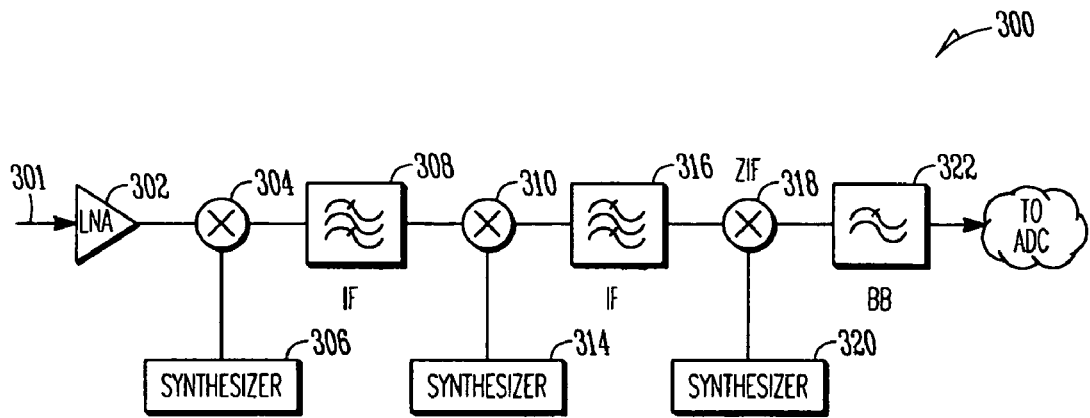
FIGS. 3A and 3B are functional diagrams of receiver circuitry in accordance with some other embodiments of the present invention.
Figure 3B:
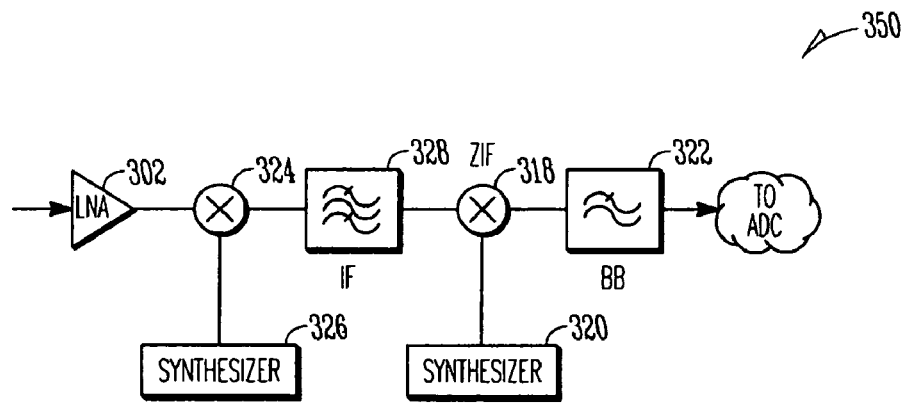

FIGS. 3A and 3B are functional diagrams of receiver circuitry in accordance with some other embodiments of the present invention. Both receiver circuitry 300 (FIG. 3A) and receiver circuitry 350 (FIG. 3B) employ a sliding IF architecture and either may be suitable for use as ZIF receiver circuitry 102 (FIG. 1), although other receiver circuitry may also be suitable. Receiver circuitry 300 (FIG. 3A) and receiver circuitry 350 (FIG. 3B) may be used in non-integrated embodiments and may be alternatives to receiver circuitry 200 (FIG. 2A) and receiver circuitry 250 (FIG. 2B).

In these embodiments, receiver circuitry 300 may include LNA 302 to amplify signals 301 received from an antenna source, IF mixer 304 to convert the received signals to a first IF frequency by the multiplication with variable LO signals from variable synthesizer 306, and IF filter 308 to filter the IF signals generated by IF mixer 304. In these embodiments, receiver circuitry 300 may also include IF mixer 310 to further convert the IF signals to a second IF frequency using variable LO signals from variable synthesizer 314, and IF filter 316 to filter the IF signals generated by IF mixer 310. In these embodiments, receiver circuitry 300 may also include ZIF mixer 318 to convert the IF signals to baseband signals using variable LO signals from variable synthesizer 320, and baseband filter 322 to filter the baseband signals generated by ZIF mixer 318. Receiver 300 uses dual sliding IF stages.

Receiver circuitry 350, on the other hand, may utilize a single sliding IF stage. In these embodiments, receiver 350 includes IF mixer 324 to convert the received signals to a first IF frequency using LO signals from variable synthesizer 326, and IF filter 328 to filter the IF signals generated by IF mixer 324.

In these embodiments, the passbands of the IF and baseband filters may partially overlap to implement sliding IF architectures. In these embodiments, baseband filters 322 are generally not tunable (i.e., the center frequency or passband may be fixed), and IF filters 308, 316 and/or 328 may be tunable to shift the passband or the center frequency, although the scope of the invention is not limited in this respect. In these embodiments, the output of baseband filters 322 may have a frequency offset, which may be corrected by an additional frequency conversion which may be performed digitally by subsequent circuitry, such as digital baseband processor 106 (FIG. 1), although the scope of the invention is not limited in this respect.

In these embodiments, some or all of synthesizers 306, 314, 320, and 326 may generate the variable LO signals, and the center frequencies or passbands of IF filters 308, 316, and/or 328 may be shifted based on the selected bandwidth. In some embodiments, synthesizers 306, 314, 320, and 326 may generate variable LO signals and the center frequencies of IF filters 308, 316, and/or 328 may be shifted based on bandwidth selection control signal 111 (FIG. 1).

Figure 4:
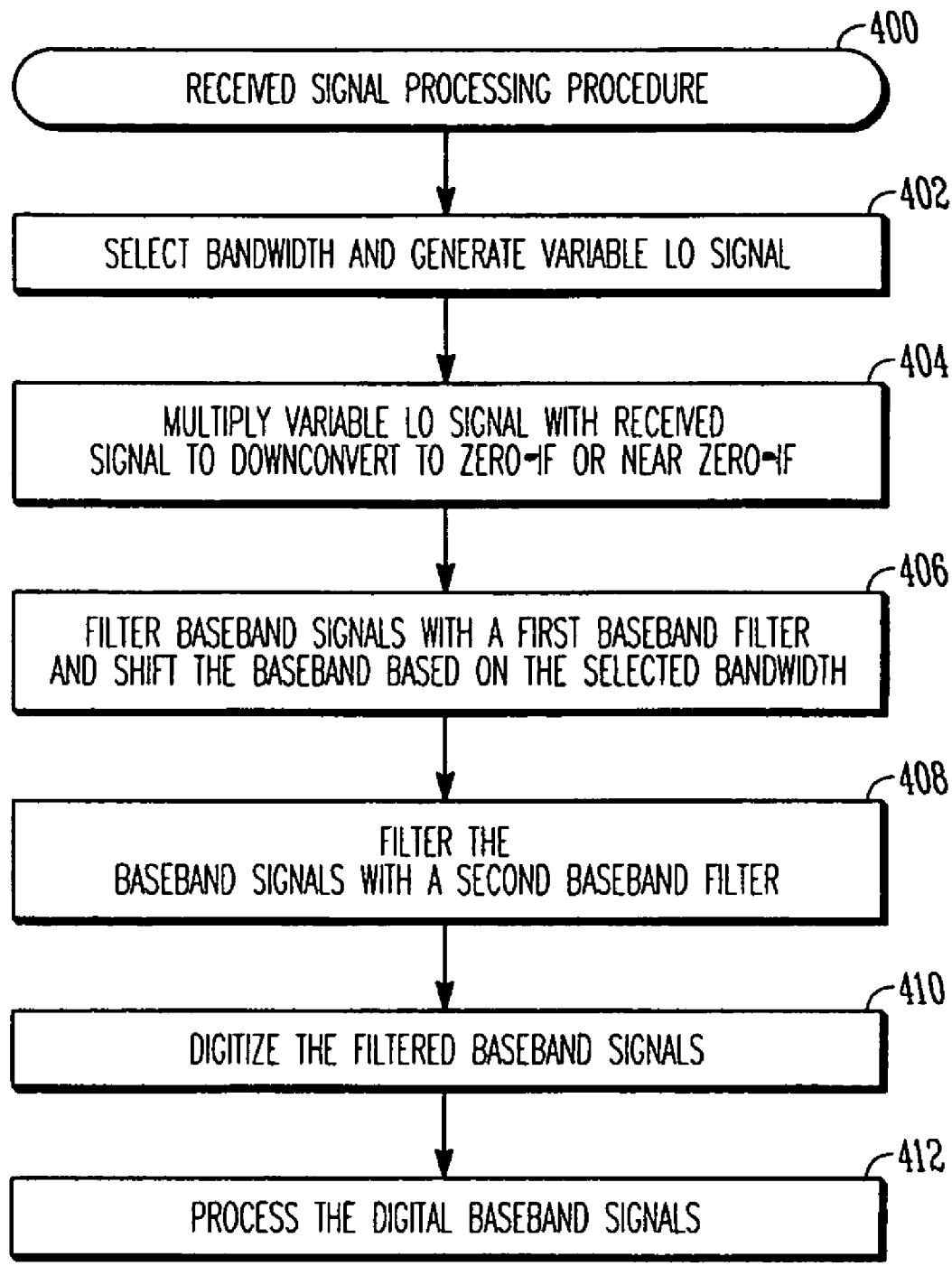
FIG. 4 is a flow chart of a received signal processing procedure in accordance with some embodiments of the present invention.

FIG. 4 is a flow chart of a received signal processing procedure in accordance with some embodiments of the present invention. Received signal processing procedure 400 may be performed by a receiver, such as receiver 100 (FIG. 1), although other receiver configurations may also be suitable.

Operation 402 comprises selecting a bandwidth and generating a variable LO signal based on the selected bandwidth. In some embodiments, the bandwidth may be selected from one of the predetermined bandwidths discussed above. In some embodiments, controller 110 (FIG. 1) may select the bandwidth and synthesizer 206 (FIGS. 2A and 2B) may generate the variable LO signal.

Operation 404 comprises multiplying the variable LO signal to a mixer and down-converting received signals to zero-IF or near zero-IF to generate baseband signals. In some embodiments, mixer 204 (FIGS. 2A and 2B) may be used to perform operation 404.

Operation 406 comprises filtering the baseband signals with a first baseband filter and shifting the passband of the first baseband filter based on the selected bandwidth. Operation 406 may use a complex baseband filter with a shiftable passband. In some embodiments, baseband filter 208 (FIGS. 2A and 2B) may be used to filter the baseband signals and passband-shifting element 210 (FIGS. 2A and 2B) may be used to shift the passband. In some embodiments, the passband of the baseband filters used in operation 406 may be shifted based on the selected bandwidth.

Operation 408 comprises filtering the baseband signals with a second baseband filter. In some embodiments, operation 408 may use either a real or a complex baseband filter, such as baseband filter 212 (FIG. 2A) with a fixed (non-shiftable) passband. In some other embodiments, operation 408 may use a complex baseband filter, such as baseband filters 216 (FIG. 2B), with a shiftable passband. In the embodiments that use a shiftable baseband filter for performing operation 408, the center frequency of the baseband filter used in operation 408 may be shifted in a direction opposite to the direction that the center frequency is shifted in the complex filter used to perform operation 406. Operations 406 and 408 may be performed concurrently to implement a sliding IF architecture.

Operation 410 comprises digitizing the filtered baseband signals generated in operation 408. In some embodiments, operation 410 may be performed by ADC circuitry 104 (FIG. 1).

Operation 412 comprises processing the digital baseband signals generated in operation 410 to generate a bit stream. In some embodiments, operation 412 may be performed by digital baseband processor 106 (FIG. 1). In some embodiments that employ a baseband filter with a fixed passband in operation 408, operation 412 may include performing an additional frequency conversion to digitally compensate for any frequency offset generated in operation 408. In some embodiments that employ a baseband filter with a shiftable passband in operation 408, operation 412 may include refraining from performing an additional frequency conversion, although the scope of the invention is not limited in this respect.

Although the individual operations of procedure 400 are illustrated and described as separate operations, one or more of the individual operations may be performed concurrently, and nothing requires that the operations be performed in the order illustrated. Although some portions of procedure 400 are described with respect to receiver circuitry 200 (FIG. 2A) and receiver circuitry 250 (FIG. 2B), some portions of procedure 400 may be equally applicable to receiver circuitry 300 (FIG. 3A) and receiver circuitry 350 (FIG. 3B). In some embodiments, the concepts of procedure 400 may also be applied to the transmission of signals with various bandwidths.

Figure 5:
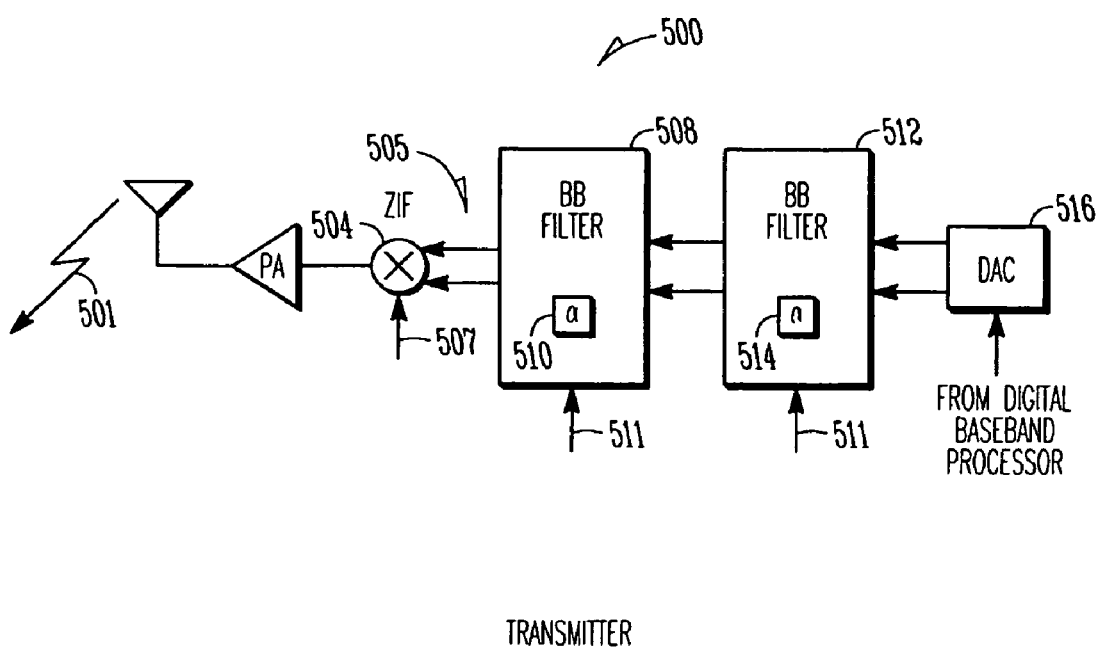
FIG. 5 is a block diagram of a multi-mode transmitter in accordance with some embodiments of the present invention.

FIG. 5 is a block diagram of a multi-mode transmitter in accordance with some embodiments of the present invention. Transmitter 500 may implement a sliding IF architecture and may be a portion of a transceiver that may include receiver 100 (FIG. 1). Transmitter 500 may use one or more baseband filters with shiftable passbands to operate in one or more modes, similar to the operation or receiver 100 (FIG. 1). In accordance with some embodiments, transmitter 500 may include mixer 504 to multiply variable LO signal 507 with baseband signals 505 having either a zero-IF or a near zero-IF to generate RF signal 501 for transmission. Transmitter 500 may also include baseband filter 508 to filter the baseband signals for mixer 504. Baseband filter 508 may include passband-shifting element 510 to shift a passband of baseband filter 508 based on a selected bandwidth. Transmitter 500 may also include baseband filter 512 to provide filtered signals to baseband filter 508. Baseband filter 512 may have a passband that partially overlaps the shifted passband of the baseband filter 508. RF signal 501 may have one of the predetermined bandwidths discussed above allowing transmitter 500 to provide multi-mode operations.

In some embodiments, baseband filter 508 may comprise a complex baseband filter with a shiftable passband and baseband filter 512 may comprise either a real or a complex baseband filter 512 with a fixed passband. In these embodiments, digital baseband processor 106 (FIG. 1) may generate digital baseband signals with a frequency offset for conversion to analog by digital-to-analog converter (DAC) 516 for the inputs of baseband filter 512. In some of these embodiments, the frequency offset may be generated by analog circuitry. In these embodiments, the passband of baseband filter 508 may be shifted based, at least in part, on the selected predetermined bandwidth. In these embodiments, the shifted passband of baseband filter 508 may partially overlap the passband of baseband filter 512 to help prevent transmission of adjacent interfering signals.

In the embodiments in which baseband filter 508 is a complex baseband filter with a shiftable passband and baseband filter 512 is a baseband filter with a fixed passband, the order of baseband filter 508 and baseband filter 512 may be interchanged. Embodiments of the present invention are equally applicable to transmitters in which a baseband filter with a fixed passband comes after a baseband filter with a shiftable passband in the signal path.

In some other embodiments, passband-shifting element 510 may comprise cross-coupled feedback elements with a variable gain ($\alpha$) to shift the passband of baseband filter 508 in a first direction based on the selected predetermined bandwidth. In these embodiments, baseband filter 512 may also comprise a complex baseband filter having passband-shifting element 514 to shift the passband of baseband filter 512 in a second direction opposite the first direction. In some embodiments, passband-shifting element 514 may comprise cross-coupled feedback elements with a variable gain ($\alpha$) to shift the passband of baseband filter 512. In these embodiments, the shifted passbands may partially overlap to help prevent transmission of adjacent interfering signals.

In some embodiments, complex baseband filter configuration 260 (FIG. 2C) may be suitable for use as either or both of baseband filters 508 and 512, although other passband shifting techniques may also be suitable. In some embodiments, the passbands of baseband filter 508 and/or baseband filter 512 may be based on bandwidth selection control signal 511, which may be provided by a controller.

Although transmitter 500 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein. In some embodiments, the functional elements of transmitter 500 may refer to one or more processes operating on one or more processing elements. Transmitter 500 may operate in accordance with any one or more of the communication techniques and frequency ranges discussed above for receiver 100 (FIG. 1).

Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices.

Embodiments of the invention may be implemented in one or a combination of hardware, firmware and software. Embodiments of the invention may also be implemented as instructions stored on a machine-readable medium, which may be read and executed by at least one processor to perform the operations described herein. A machine-readable medium may include any mechanism for storing or transmitting information in a form readable by a machine (e.g., a computer). For example, a machine-readable medium may include read-only memory (ROM), random-access memory (RAM), magnetic disk storage media, optical storage media, flash-memory devices, electrical, optical, acoustical or other form of propagated signals (e.g., carrier waves, infrared signals, digital signals, etc.), and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention may lie in less than all features of a single disclosed embodiment. Thus, the following claims are hereby incorporated into the detailed description, with each claim standing on its own as a separate preferred embodiment.

What is claimed is:

1. A multi-mode receiver with a programmable bandwidth comprising: a mixer to multiply a variable local-oscillator (LO) signal with a received radio frequency (RF) signal to generate baseband signals having either a zero-intermediate frequency (IF) or a near zero-IF; a first baseband filter to filter the baseband signals having a passband-shifting element to shift a passband of the first baseband filter based on a selected bandwidth; a second baseband filter to receive filtered signals from the first baseband filter, the second baseband filter having a passband that partially overlaps the shifted passband of the first baseband filter; and analog-to-digital conversion (ADC) circuitry to convert analog baseband outputs from the second baseband filter to digital baseband signals, wherein the passband of the first baseband filter is shifted to provide a partial overlap with the passband of the second baseband filter in response to a selection control signal, wherein the second baseband filter comprises a second complex baseband filter with a shiftable passband configured to shift the passband of the second baseband filter in a second direction opposite the first direction in response to the selection control signal, and wherein the passbands of the first and second baseband filters substantially overlap prior to being shifted to provide for full-bandwidth operations.

2. The receiver of claim 1 further comprising a synthesizer to generate the variable LO signal based on a selected one of a plurality of predetermined bandwidths,
wherein the first baseband filter is a complex baseband filter and the passband-shifting element comprise cross-coupled feedback elements having a variable gain to shift the passband of the first baseband filter based on the selected predetermined bandwidth, and
wherein a passband of the second baseband filter does not substantially overlap with the shifted passband of the first baseband filter.

3. The receiver of claim 2 wherein the first baseband filter comprises a complex baseband filter with a shiftable passband,
wherein the second baseband filter comprises a baseband filter with a fixed passband,
wherein the receiver further comprises a digital baseband processor to perform a digital frequency conversion to compensate, at least in part, for frequency offset at outputs of the second baseband filter,
wherein the passband of the first baseband filter is shifted based, at least in part, on the selected predetermined bandwidth, and
wherein the shifted passband of the first baseband filter partially overlaps the passband of the second baseband filter to help remove adjacent interfering signals.

4. A multi-mode receiver with a programmable bandwidth comprising:
a mixer to multiply a variable local-oscillator (LO) signal with a received radio-frequency (RF) signal to generate baseband signals having either a zero-intermediate frequency (IF) or a near zero-IF;
a first baseband filter to filter the baseband signals having a passband-shifting element to shift a passband of the first baseband filter based on a selected bandwidth;
a second baseband filter to receive filtered signals from the first baseband filter, the second baseband filter having a passband that partially overlaps the shifted passband of the first baseband filter; and
a synthesizer to generate the variable LO signal based on a selected one of a plurality of predetermined bandwidths,
wherein the first baseband filter is a complex baseband filter and the passband-shifting element comprise cross-coupled feedback elements having a variable gain to shift the passband of the first baseband filter based on the selected predetermined bandwidth,
wherein a passband of the second baseband filter does not substantially overlap with the shifted passband of the first baseband filter,
wherein the first baseband filter comprises a first complex baseband filter with a shiftable passband,
wherein the passband-shifting element comprises first cross-coupled feedback elements with a variable gain to shift the passband of the first baseband filter in a first direction based on the selected predetermined bandwidth,
wherein the second baseband filter comprises a second complex baseband filter with a shiftable passband having second cross-coupled feedback elements with a variable gain to shift the passband of the second baseband filter in a second direction opposite the first direction, and
wherein the shifted passbands partially overlap when shifted to help remove adjacent interfering signals.

5. The receiver of claim 4 wherein analog baseband outputs from the second baseband filter are zero-frequency outputs with substantially zero frequency offset, and
wherein the first and second cross-coupled feedback elements comprise cross-branch transconductor loops having transconductances that are varied to shift the passbands of the first and second baseband filters.

6. The receiver of claim 4 wherein the receiver further comprises:
analog-to-digital conversion (ADC) circuitry to convert analog baseband outputs from the second baseband filter to digital baseband signals; and
a digital baseband processor to process the digital baseband signals and generate an output bit stream,
wherein the analog baseband outputs of the second baseband filter have substantially zero frequency offset, and
wherein the digital baseband processor refrains from performing a digital frequency conversion on the digital baseband signals.

7. The receiver of claim 4 wherein the first and second baseband filters comprise polyphase filters,
wherein the first cross-coupled feedback elements shift one or more poles of the first baseband filter in response to bandwidth selection control signals, and wherein the second cross-coupled feedback elements shift one or more poles of the second baseband filter in response to the bandwidth selection control signals.

8. The receiver of claim 1 further comprising:
a controller to generate bandwidth selection control signals based on the selected one of a plurality of predetermined bandwidths and to provide the bandwidth selection control signals to a synthesizer for generating the variable LO signals,
wherein the variable bandwidth comprises bandwidth classes of channels ranging from 1.25 MHz up to 20 MHz, and
wherein the passband-shifting element shifts the passband of the first baseband filter based on the bandwidth selection control signals.

9. The receiver of claim 8 wherein the predetermined bandwidths comprise at least two of:
approximately a 20 MHz bandwidth for either wireless local area network (WLAN) or wireless fidelity (WiFi) applications;
approximately a 1.25 MHz bandwidth for third-generation (3G) cellular applications;
approximately a 3 MHz bandwidth for wideband code division multiple access (WCDMA) applications; or
approximately a 220 kHz to 270 kHz bandwidth for global system for mobile communications (GSM) applications.

10. The receiver of claim 8 wherein mixer, the first baseband filter, the passband-shifting element, the second baseband filter, and the synthesizer comprise receiver circuitry, wherein the receiver further comprises:
a digital baseband processor to process the digital baseband signals and generate an output bit stream, and
wherein the receiver circuitry and the ADC circuitry are fabricated as part of a single RF integrated circuit.

11. The receiver of claim 4 wherein the mixer comprises a zero-IF mixer and generates in-phase (I) and quadrature-phase (Q) outputs,
wherein the first baseband filter comprises a first portion to receive the in-phase output and a second portion to receive the quadrature-phase output,
wherein the second baseband filter comprises a first portion to receive a first filtered signal from the first portion of the first baseband filter and a second portion to receive a second filtered signal from the second portion.

12. A method of processing received signals performed by a multi-mode receiver, the method comprising:
multiplying a variable local-oscillator (LO) signal with a received radio-frequency (RF) signal to generate baseband signals having either a zero-IF or a near zero-IF;
filtering the baseband signals with a first baseband filter;
shifting a passband of the first baseband filter based on a selected bandwidth with a first passband-shifting element; and
filtering signals from the first baseband filter with a second baseband filter;
shifting a passband of the second baseband filter in a direction opposite that of the passband of the first baseband filter with a second passband-shifting element, wherein the first and second baseband filters have passbands that partially overlap after the shifting; and
processing baseband signals provided by the second baseband filter to generate an output bit stream.

13. The method of claim 12 further comprising:
generating the variable LO signal with a synthesizer based on a selected one of a plurality of predetermined bandwidths,
wherein the first baseband filter is a complex baseband filter with a shiftable passband and the passband-shifting element comprises cross-coupled feedback elements having a variable gain,
wherein the second baseband filter is a complex baseband filter and the second passband-shifting element comprises cross-coupled feedback elements having a variable gain to shift the passband of the second baseband filter in a direction opposite that of which the passband of the first baseband filter is shifted based on the selected bandwidth, and
wherein shifting comprises varying the variable gain of the cross-coupled feedback elements to shift the passbands of the first and second baseband filters in opposite directions based on the selected bandwidth.

14. The method of claim 13 wherein the passbands of the first and second baseband filters substantially overlap prior to the shifting.

15. A method of processing received signals performed by a multi-mode receiver, the method comprising:
multiplying a variable local-oscillator (LO) signal with a received radio-frequency (RF) signal to generate baseband signals having either a zero-IF or a near zero-IF;
filtering the baseband signals with a first baseband filter;
shifting a passband of the first baseband filter based on a selected bandwidth with a passband-shifting element;
filtering signals from the first baseband filter with a second baseband filter, the second baseband filter having a passband that partially overlaps the shifted passband of the first baseband filter;
processing baseband signals provided by the second baseband filter to generate an output bit stream; and
generating the variable LO signal with a synthesizer based on a selected one of a plurality of predetermined bandwidths,
wherein the first baseband filter is a complex baseband filter with a shiftable passband and the passband-shifting element comprise cross-coupled feedback elements having a variable gain,
wherein shifting comprises varying the variable gain of the cross-coupled feedback elements to shift the passband of the first baseband filter based on the selected predetermined bandwidth,
wherein during the shifting a passband of the second baseband filter does not substantially overlap with the shifted passband of the first baseband filter,
wherein the first baseband filter comprises a first complex baseband filter with a shiftable passband,
wherein the passband-shifting element comprises first cross-coupled feedback elements with a variable gain,
wherein shifting the passband of the first baseband filter comprises shifting the passband of the first baseband filter in a first direction based on the selected predetermined bandwidth by varying the variable gain,
wherein the second baseband filter comprises a second complex baseband filter with a shiftable passband having second cross-coupled feedback elements with a variable gain,
wherein the method further comprises shifting the passband of the second baseband filter in a second direction opposite the first direction by varying the variable gain of the second cross-coupled feedback elements, and
wherein the shifted passbands partially overlap during the shifting to help remove adjacent interfering signals.

16. The method of claim 15 further comprising providing analog baseband outputs from the second baseband filter with substantially zero frequency offset, wherein the first and second cross-coupled feedback elements comprise cross-branch transconductor loops, and wherein shifting the passbands comprises varying transconductances of the cross-branch transconductor loops.

17. The method of claim 16 further comprising:
converting analog baseband outputs from the second baseband filter to digital baseband signals;
processing the digital baseband signals to generate the output bit stream; and
refraining from performing a digital frequency conversion on the digital baseband signals.

18. The method of claim 15 wherein the first and second baseband filters comprise polyphase filters,
wherein shifting the passband of the first baseband filter comprises shifting one or more poles of the first baseband filter in response to bandwidth selection control signals, and
wherein shifting the passband of the second baseband filter comprises shifting one or more poles of the second baseband filter in response to the bandwidth selection control signals.

19. The method of claim 12 further comprising:
generating bandwidth selection control signals based on the selected one of a plurality of predetermined bandwidths; and
providing the bandwidth selection control signals to a synthesizer for generating the variable LO signals,
wherein the variable bandwidth comprises bandwidth classes of channels ranging from 1.25 MHz up to 20 MHz, and
wherein shifting the passband of the first baseband filter is based on the bandwidth selection control signals.

20. The method of claim 19 wherein the predetermined bandwidths comprise at least two of:
approximately a 20 MHz bandwidth for either wireless local area network (WLAN) or wireless fidelity (WiFi) applications;
approximately a 1.25 MHz bandwidth for third-generation (3G) cellular applications;
approximately a 3 MHz bandwidth for wideband code division multiple access (WCDMA) applications; or
approximately a 220 kHz to 270 kHz bandwidth for global system for mobile communications (GSM) applications.

21. The method of claim 19 further comprising:
converting analog outputs from the second baseband filter to digital baseband signals; and
processing the digital baseband signals to generate an output bit stream.

22. A receiver system comprising:
a mixer to multiply a variable local-oscillator (LO) signal with a radio-frequency (RF) signal received through the antenna to generate baseband signals having either a zero-IF or a near zero-IF;
a first baseband filter to filter the baseband signals having a first passband-shifting element to shift a passband of the first baseband filter based on a selected bandwidth; and
a second baseband filter to receive filtered signals from the first baseband filter, the second baseband filter having a second passband-shifting element to shift a passband of the second baseband filter based on the selected bandwidth,
wherein the passbands of the first and second baseband filters are shifted in opposite directions, and
wherein the passbands of the first and second baseband filters partially overall after being shifted.

23. The receiver system of claim 22 further comprising a synthesizer to generate the variable LO signal based on a selected one of a plurality of predetermined bandwidths,
wherein the first baseband filter is a complex baseband filter and the first passband-shifting element comprises cross-coupled feedback elements having a variable gain to shift the passband of the first baseband filter based on the selected predetermined bandwidth,
wherein the second baseband filter is a complex baseband filter and the second passband-shifting element comprises cross-coupled feedback elements having a variable gain to shift the passband of the second baseband filter in a direction opposite that of which the passband of the first baseband filter is shifted based on the selected predetermined bandwidth,
wherein after the shifting, the passband of the second baseband filter does not substantially overlap with the shifted passband of the first baseband filter.

24. A receiver system comprising:
a substantially omnidirectional antenna;
a mixer to multiply a variable local-oscillator (LO) signal with a radio-frequency (RF) signal received through the antenna to generate baseband signals having either a zero-IF or a near zero-IF;
a first baseband filter to filter the baseband signals having a passband-shifting element to shift a passband of the first baseband filter based on a selected bandwidth;
a second baseband filter to receive filtered signals from the first baseband filter, the second baseband filter having a passband that partially overlaps the shifted passband of the first baseband filter; and
a synthesizer to generate the variable LO signal based on a selected one of a plurality of predetermined bandwidths,
wherein the first baseband filter is a complex baseband filter and the passband-shifting element comprise cross-coupled feedback elements having a variable gain to shift the passband of the first baseband filter based on the selected predetermined bandwidth,
wherein a passband of the second baseband filter does not substantially overlap with the shifted passband of the first baseband filter,
wherein the first baseband filter comprises a first complex baseband filter with a shiftable passband,
wherein the passband-shifting element comprises first cross-coupled feedback elements with a variable gain to shift the passband of the first baseband filter in a first direction based on the selected predetermined bandwidth,
wherein the second baseband filter comprises a second complex baseband filter with a shiftable passband having second cross-coupled feedback elements with a variable gain to shift the passband of the second baseband filter in a second direction opposite the first direction, and
wherein the shifted passbands partially overlap to help remove adjacent interfering signals.

25. A sliding intermediate frequency (IF) receiver with programmable bandwidth comprising:
an IF mixer to generate IF signals by multiplying first variable local oscillator (LO) signals with received radio-frequency (RF) signals;
an IF filter with a shiftable center frequency to filter the IF signals;
a zero-IF (ZIF) mixer to generate baseband signals having either a zero-IF or a near zero-IF by multiplying second variable LO signals with the filtered IF signals; and a baseband filter with a fixed passband to filter the baseband signals, wherein the first and second LO signals are varied together based on a selected one of a plurality of predetermined bandwidths, and wherein the center frequency of the IF filter is shifted based on the selected predetermined bandwidth.

26. The receiver of claim 25 wherein the IF mixer is a first IF mixer that generates first IF signals, wherein the IF filter is a first IF filter that filters the first IF signals, and wherein the receiver further comprises:

a second IF mixer to generate second IF signals by multiplying third variable LO signals with the received RF signals; and a second IF filter with a shiftable center frequency to filter the second IF signals and provide the filtered second IF signals to the second IF mixer.

27. The receiver of claim 26 wherein the third variable LO signals are varied together with the first and second variable LO signals based on the selected predetermined bandwidth, and wherein the center frequency of the second IF filter is shifted based on the selected predetermined bandwidth to partially overlap with the first IF filter.

* * * * *

UNITED STATES PATENT AND TRADEMARK OFFICE
CERTIFICATE OF CORRECTION

PATENT NO. : 7,590,205 B2 Page 1 of 1
APPLICATION NO. : 11/374584
DATED : September 15, 2009
INVENTOR(S) : Eliav Zipper It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 782 days.

Signed and Sealed this

Twenty-first Day of September, 2010

David J. Kappos
*Director of the United States Patent and Trademark Office*